(12) United States Patent
Na

(10) Patent No.: US 9,035,409 B2
(45) Date of Patent: May 19, 2015

(54) GERMANIUM PHOTODETECTOR HAVING ABSORPTION ENHANCED UNDER SLOW-LIGHT MODE

(71) Applicant: Forelux Inc., Taipei (TW)

(72) Inventor: Yun-Chung Na, Hsinchu (TW)

(73) Assignee: Forelux Inc., Taipei (TW)

( * ) Notice: Subject to any disclaimer, the term of this patent is extended or adjusted under 35 U.S.C. 154(b) by 0 days.

(21) Appl. No.: 14/157,758

(22) Filed: Jan. 17, 2014

(65) Prior Publication Data

US 2015/0069565 A1 Mar. 12, 2015

(30) Foreign Application Priority Data

Sep. 12, 2013 (TW) .............................. 102133064 A

(51) Int. Cl.
*H01L 31/0236* (2006.01)
*G02B 6/26* (2006.01)

(52) U.S. Cl.
CPC ............ *H01L 31/02363* (2013.01); *G02B 6/26* (2013.01)

(58) Field of Classification Search
CPC .................................................. H01L 31/0236
USPC .............................................. 257/436; 385/2
See application file for complete search history.

(56) References Cited

U.S. PATENT DOCUMENTS

| | | | |
|---|---|---|---|
| 2005/0265660 A1* | 12/2005 | Miller .............................. | 385/43 |
| 2010/0330727 A1* | 12/2010 | Hill et al. .......................... | 438/69 |
| 2011/0170819 A1* | 7/2011 | Zheng et al. ...................... | 385/2 |
| 2013/0071058 A1* | 3/2013 | Lim et al. ........................... | 385/2 |
| 2013/0336346 A1* | 12/2013 | Kobrinsky et al. ............... | 372/26 |

* cited by examiner

*Primary Examiner* — Marc Armand
*Assistant Examiner* — Younes Boulghassoul
(74) *Attorney, Agent, or Firm* — Fish & Richardson P.C.

(57) ABSTRACT

A novel germanium (Ge) photodetector is disclosed, containing a stripe layer including Ge, a substrate supporting the stripe layer, and P and N regions, which are located inside the substrate and near opposite sides of the stripe. The stripe layer containing Ge for light absorption is operated in a slow-light mode by adding combinations of a gradual taper indent structure and a periodic indent structure to reduce light scatterings and to control light group velocity inside the stripe. Due to the slower light traveling velocity inside the stripe, the absorption coefficient of the stripe containing Ge is upgraded to be 1 to 2 orders of magnitude larger than that of a traditional bulk Ge at L band, and so the absorption coefficient reaches more than 1 dB/μm at the wavelength of 1600 nm.

17 Claims, 4 Drawing Sheets

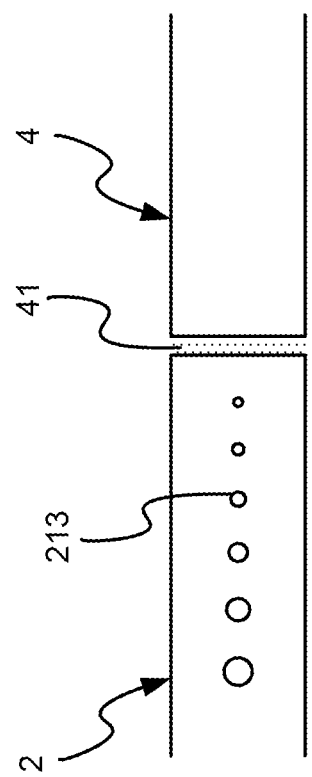

GERMANIUM PHOTODETECTOR HAVING ABSORPTION ENHANCED UNDER SLOW-LIGHT MODE

TECHNICAL FIELD OF THE INVENTION

The present invention relates to a germanium (Ge) photodetector; more particularly, relates to enhancing a Ge absorption coefficient through operating a Ge stripe in a slow-light mode.

DESCRIPTION OF THE RELATED ART

Silicon germanium (SiGe) photodetector is a popular receiver owing to its compatibility to CMOS producing procedure and its low production cost. Yet, its low absorption performance at 1550 nanometers (nm) limits the use in wavelength-division multiplexing (WDM) of the L band section (1564 nm~1625 nm), which is owing to the ~0.8 eV direct energy gap of Ge. Although Ge can be grown on silicon (Si) to introduce tensile strain for enhancing long-wavelength absorption, a high-temperature process is required and so limits the thermal budget. This makes the integration of Ge photodetector and the integrated circuit, like adding a transimpedance amplifier (TIA) on a single chip, more difficult. In another aspect, such high temperature process will affect all Ge photodetectors on the same wafer; hence it is difficult to tune individual Ge absorption spectrum to fulfill WDM need. As a result, prior art does not fulfill all users' requests on actual usage scenario.

SUMMARY OF THE INVENTION

The main purpose of the present invention is to enhance a Ge absorption coefficient through operating a Ge stripe in a slow-light mode by creating a gradual taper indent structure and a periodic indent structure in the stripe, which can be defined using lithography to upgrade the Ge stripe absorption coefficient to be 1 to 2 orders of magnitude larger than that of a traditional bulk Ge at L band.

To achieve the above purpose, the present invention is a Ge photodetector having absorption enhanced under a slow-light mode, comprising a silicon-on-insulator (SOI) substrate and a stripe layer containing Ge, where the SOI substrate comprises a Si substrate, an oxide layer and a Si island layer; the Si island layer comprises a bulk-stripe layer interface and two flat surfaces; the two flat surfaces are separately set on two sides of the bulk-stripe layer interface; a first doped area and a second doped area are separately extended from underneath the bulk-stripe layer interface until underneath the flat surfaces; the stripe layer is set on the Si island layer above the bulk-stripe layer interface; the stripe layer comprises an upper surface, a first side surface and a second side surface; the second side surface is on the opposite side of the first side surface; the stripe layer has a third doped area and a fourth doped area inside the first side surface and the second side surface; and the stripe layer has a gradual taper indent structure at a direction toward an light-inlet side and a periodic indent structure following the gradual taper indent structure. Accordingly, a Ge photodetector having absorption enhanced under a slow-light mode at L band is obtained. A p-i-n junction consisting of the aforementioned doped areas is used to collect generated photo-carriers due to optical absorption. The gradual taper indent structure reduces the scatterings when light from the light-inlet side moves toward the periodic structure. The periodic indent structure induces a large dispersion in which the group velocity of light approaches zero at the optical band edges. At these optical band edges, the optical absorption is largely enhanced because it is inversely proportional to the group velocity.

BRIEF DESCRIPTIONS OF THE DRAWINGS

The present invention will be better understood from the following detailed description of the preferred embodiment according to the present invention, taken in conjunction with the accompanying drawings, in which FIG. 1 is the perspective view showing the preferred embodiment according to the present invention;

FIG. 3 is the view showing the Ge photodetector butt-coupled to the SOI waveguide.

DESCRIPTION OF THE PREFERRED EMBODIMENT

The following description of the preferred embodiment is provided to understand the features and the structures of the present invention.

Figure 1:
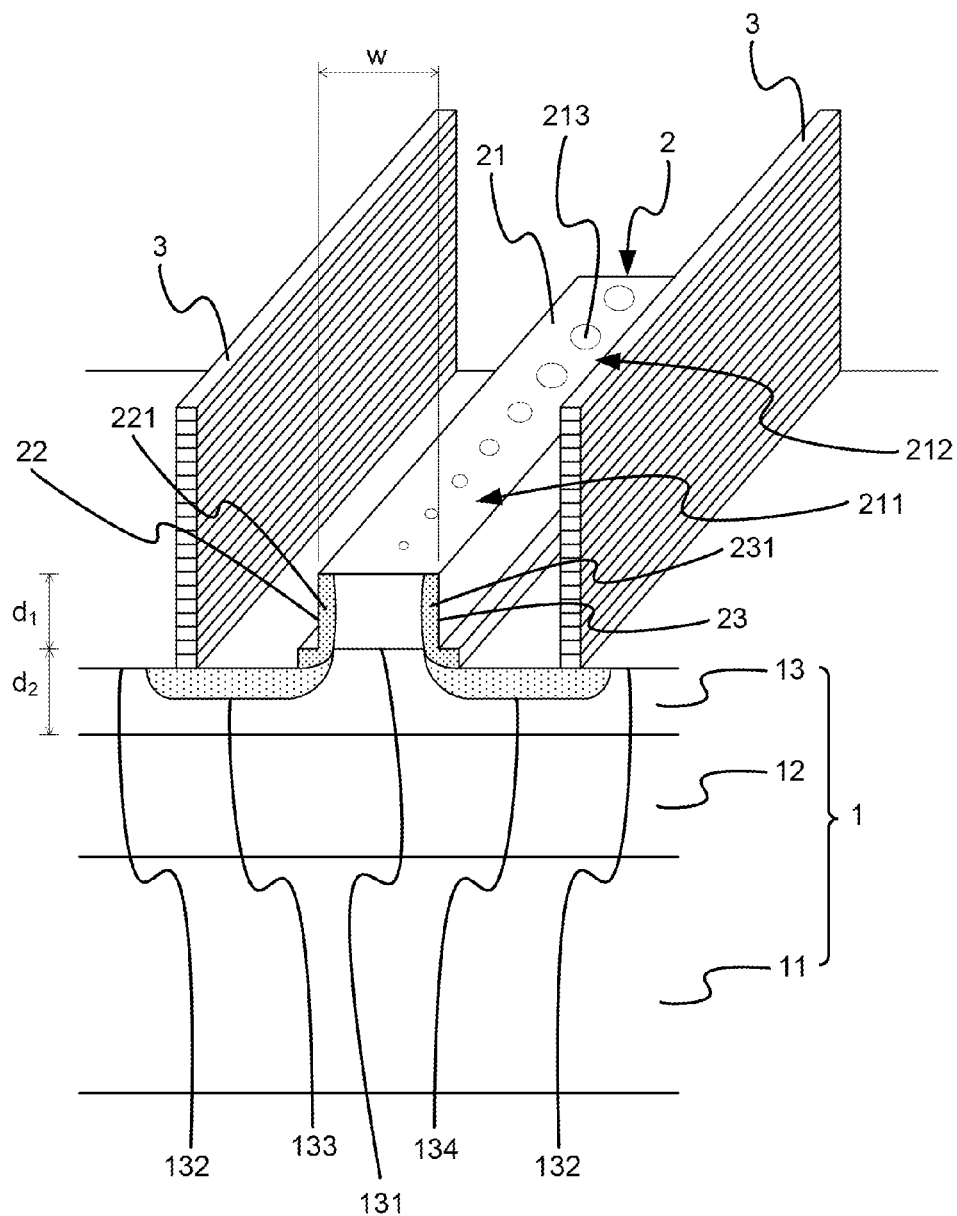

Please refer to FIG. 1 to FIG. 3, which are a perspective view showing a preferred embodiment according to the present invention; views showing a first and a second preferred embodiments of germanium (Ge) stripe layers; and a view showing a Ge photodetector butt-coupled to a silicon-on-insulator (SOI) waveguide. As shown in the figures, the present invention is a Ge photodetector having absorption enhanced under a slow-light mode, comprising a SOI substrate 1, a stripe layer 2 containing Ge, a gradual taper structure 211, and a periodic structure 212 following the gradual taper structure.

The SOI substrate 1 comprises a silicon (Si) substrate 11, an oxide layer 12 and a Si island layer 13, sequentially. The Si island layer 13 comprises a bulk-stripe layer interface 131; and two flat surfaces 132 on two sides of the bulk-stripe layer interface 131. A first doped area 133 and a second doped area 134 are separately extended from underneath the bulk-stripe layer interface 131 until underneath the flat surfaces 132. The first doped area 133 and the second doped area 134 have two opposite polarities. When the first doped area 133 is an n$^+$-doped area, the second doped area 134 is a p$^+$-doped area. When the first doped area 133 is a p$^+$-doped area, the second doped area 134 is an n$^+$-doped area.

The stripe layer 2 is formed on top of the bulk-stripe layer interface 131 of the Si island layer 13 in the SOI substrate 1. The stripe layer 2 comprises an upper surface 21; a first side surface 22; and a second side surface 23 corresponding to the first side surface 22. The upper surface 21 has a gradual taper structure 211 at a direction toward a light-inlet side; and a periodic structure 212 following the gradual taper structure.

In one preferred embodiment, the stripe layer 2 has a third doped area 221 and a fourth doped area 231 inside the first side surface 22 and the second side surface 23, respectively. The first doped area 133 and the third doped area 221 have the same polarity and the second doped area 134 and the fourth doped area 231 have the same polarity. Therein, the third doped area 221 and the fourth doped area 231 are formed on the first side surface 22 and the second side surface 23 of the stripe layer 2 through sidewall doping, respectively, and have opposite polarities. When the third doped area 221 is an n+-doped area, the fourth doped area 231 is a p+-doped area. When the third doped area 221 is a p+-doped area, the fourth doped area 231 is an n+-doped area.

In one preferred embodiment, the metal electrodes 3 are set on the flat surface 132 of the Si island layer 13; more particularly, on the first doped area 133 and the second doped area 134.

In one preferred embodiment, the stripe layer 2 has a thickness (d1) smaller than 2 micrometers (μm) due to bandwidth and fabrication considerations.

In one preferred embodiment, the Si island layer 13 has a thickness (d2) larger than 100 nm; and, a thickness of the first and the second doped areas 133, 134 occupies at least 5% of the thickness (d2) of the Si island layer 13 to have sufficient dopants inside the Si island layer.

In one preferred embodiment, the stripe layer 2 and the Si island layer 13 are bonded through direct bonding or the stripe containing Ge is grown epitaxially on top of the Si island layer 13.

Figure 2A:
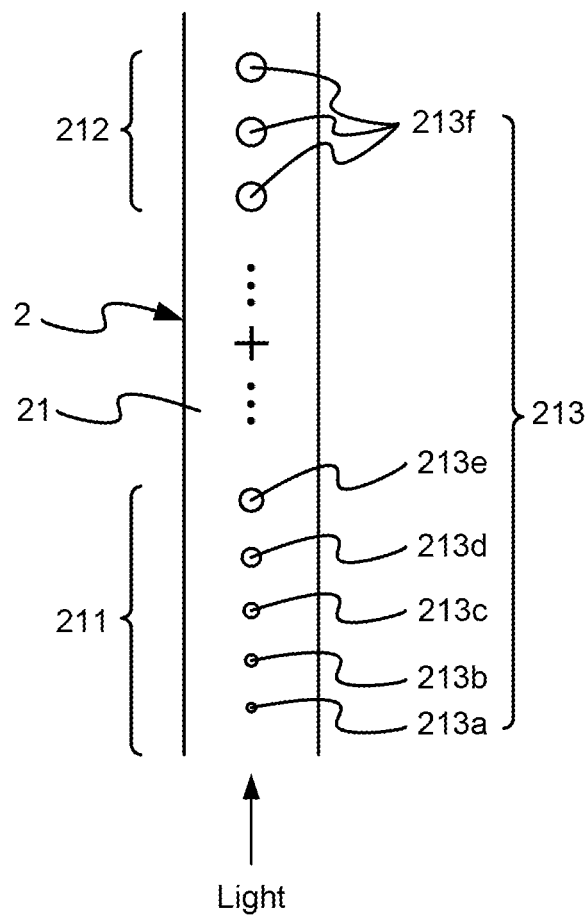
FIG. 2A is a top view showing a first preferred embodiment of Ge stripe layer with gradual taper and periodic hole structure.

In one preferred embodiment as shown in FIG. 2A, the upper surface 21 has a plurality of holes 213. Therein, the holes 213 in the gradual taper structure 211 are gradually tapered at the direction toward the light-inlet side; the holes 213 in the periodic structure 212 have the same size; and, for example, a biggest one 213e and a smallest one 213a of the holes 213 have a size difference larger than 5%. The number of the holes and the formations such as rows, columns, of 213 are changeable.

Figure 2B:
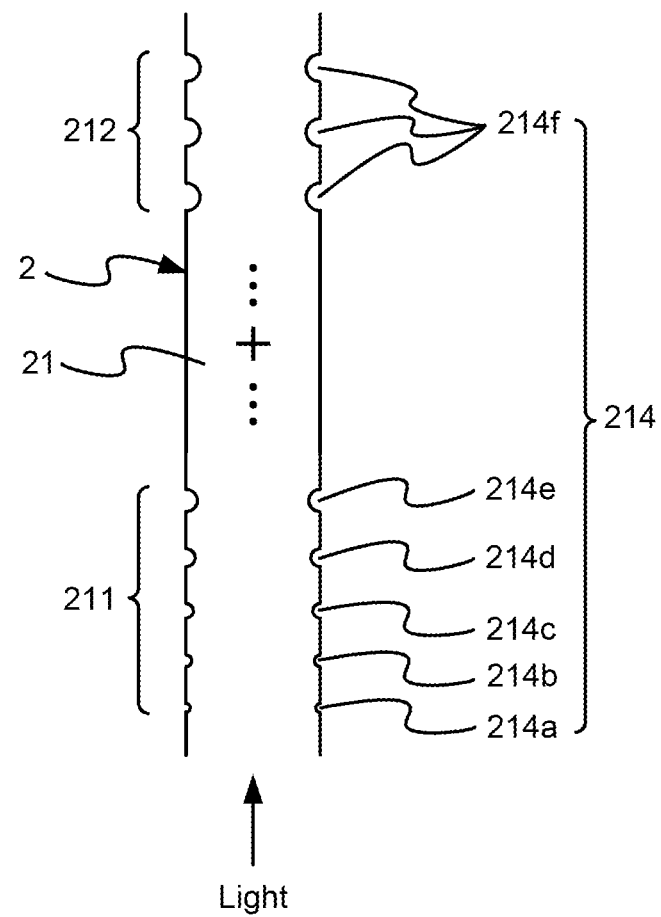
FIG. 2B is a top view showing a second preferred embodiment of Ge stripe layer with gradual taper and periodic notch structure.

In one preferred embodiment as shown in FIG. 2B, the upper surface 21 has a plurality of notches 214 at each of two long sides. Therein, the notches 214 in the gradual taper structure 211 are gradually tapered at the direction toward the light-inlet side; the notches 214 in the periodic structure 212 have the same size; and, for example, a biggest one 214e and a smallest one 214a of the notches 214 have a size difference larger than 5%. The notches 214 at the two long sides of the upper surface 21 are parallel-arranged or cross-arranged. The number of the notches and the formations such as rows columns of 214 are changeable.

Thus, a novel Ge photodetector having absorption enhanced under a slow-light mode is obtained.

In FIG. 3, the stripe layer 2 is butt-coupled with the SOI waveguide 4; a distance between the stripe layer 2 and the SOI waveguide 4 is 10 nm~100 nm; and, an oxide layer 41 is filled in the distance. On using the present invention, the Ge stripe absorption coefficient is upgraded to be 1 to 2 orders of magnitude larger than that of a traditional bulk Ge at L band with the stripe layer 2 containing Ge operated in a slow-light mode. Thus, the absorption is greatly enhanced.

Hence, the present invention operates a stripe layer containing Ge for light absorption in a slow-light mode by using the design combinations of a gradual taper structure and a periodic structure for controlling group velocity. Therein, a thickness of the Ge stripe layer and a thickness of a Si island layer, a number and size of a gradual taper structure and a number and size of a periodic structure are used as parameters for upgrading a Ge stripe absorption coefficient to be 1 to 2 orders of magnitude larger than that of a traditional bulk Ge at L band. Consequently, the absorption coefficient reaches more than 1 dB/μm at the wavelength of 1600 nm.

To sum up, the present invention is a Ge photodetector having absorption enhanced under a slow-light mode, where a Ge stripe layer is operated in a slow-light mode for upgrading a Ge stripe absorption coefficient to be 1 to 2 orders of magnitude larger than that of a traditional bulk Ge at L band.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A photodetector having absorption enhanced under a slow-light mode, comprising
    a silicon-on-insulator (SOI) substrate, said SOI substrate comprising an insulating layer and a Si island layer on top of said insulating layer, said Si island layer comprising a bulk-stripe layer interface and two flat surfaces, said two flat surfaces being separately located on two sides of said bulk-stripe layer interface; and
    a stripe layer containing Ge, said stripe layer being obtained on top of said Si island layer, said stripe layer comprising an upper surface, a first side surface and a second side surface, said second side surface is at opposite side of said first side surface,
    wherein said stripe layer has a gradual taper indent structure at a direction toward an light-inlet side and a periodic indent structure following said gradual taper indent structure,
    wherein said stripe layer is butt-coupled to a SOI waveguide,
    wherein a distance between said stripe layer and said SOI waveguide is 10 nm to 100 nm; and
    wherein a dielectric layer is located in said distance.

2. The photodetector according to claim 1,
    wherein a first flat surface of said two flat surfaces comprises a first doped area,
    wherein a second flat surface of said two flat surfaces comprises a second doped area,
    wherein said stripe layer has a third doped area and a fourth doped area inside said first side surface and said second side surface, respectively; and
    wherein said first doped area and said third doped area have the same polarity and said second doped area and said fourth doped area have the same polarity.

3. The photodetector according to claim 2,
    wherein said third doped area and said fourth doped area are respectively obtained on said first side surface and said second side surface of said stripe layer by doping two side walls; and
    wherein said third doped area and said fourth doped area have two opposite polarities.

4. The photodetector according to claim 1,
    wherein said stripe layer has a thickness thinner than 2 micrometers.

5. The photodetector according to claim 1,
    wherein said stripe layer has a plurality of holes on said upper surface;
    wherein said gradual taper indent structure containing holes with opening size gradually tapered from small to big at a direction leaving the light-inlet;
    wherein said periodic indent structure containing holes with the same opening size.

6. The photodetector according to claim 5, wherein the hole top opening size difference between the smallest and the largest of said holes is larger than 5%.

7. The photodetector according to claim 1,
    wherein said gradual taper indent structure containing notches with opening size gradually tapered from small to big on two opposite sides along the direction leaving the light-inlet;
    wherein said periodic indent structure containing notches with the same opening size on the two opposite sides following the gradual taper indent structure.

8. The photodetector according to claim 7, wherein the notch top opening size difference between the smallest and the largest of said notches is larger than 5%.

9. The photodetector according to claim 1,
wherein said Si island layer has a thickness thicker than 100 nanometers (nm).

10. The photodetector according to claim 2,
wherein the thickness of both said first and said second doped areas occupies at least 5% of the thickness of said Si island layer.

11. The photodetector according to claim 1,
wherein said stripe layer and said Si island layer are bonded through a method selected from a group consisting of direct bonding and epitaxy.

12. A photodetector having absorption enhanced under a slow-light mode, comprising:
a silicon-on-insulator (SOI) substrate, the SOI substrate comprising an insulating layer and a Si island layer on the insulating layer, the Si island layer comprising a bulk-stripe layer interface and two flat surfaces, the two flat surfaces being separately located on two sides of the bulk-stripe layer interface; and
a stripe layer containing Ge, the stripe layer being obtained on the Si island layer, the stripe layer comprising an upper surface, a first side surface and a second side surface, the second side surface is at opposite side of the first side surface,
wherein the stripe layer includes a gradual taper indent structure at a direction toward an light-inlet side and a periodic indent structure following the gradual taper indent structure,
wherein the gradual taper indent structure containing notches with opening size gradually tapered from small to big on two opposite sides along the direction leaving the light-inlet, and
wherein the periodic indent structure containing notches with the same opening size on the two opposite sides following the gradual taper indent structure.

13. The photodetector of claim 12,
wherein a first flat surface of the two flat surfaces comprises a first doped area,
wherein a second flat surface of the two flat surfaces comprises a second doped area.

14. The photodetector of claim 12,
wherein the stripe layer has a thickness thinner than 2 micrometers.

15. The photodetector of claim 12,
wherein the Si island layer has a thickness thicker than 100 nanometers (nm).

16. The photodetector of claim 13,
wherein the thickness of the first and the second doped areas occupies at least 5% of the thickness of said Si island layer.

17. The photodetector of claim 12,
wherein the stripe layer and the Si island layer are bonded through bonding or epitaxy.

* * * * *

UNITED STATES PATENT AND TRADEMARK OFFICE
CERTIFICATE OF CORRECTION

PATENT NO. : 9,035,409 B2  
APPLICATION NO. : 14/157758  
DATED : May 19, 2015  
INVENTOR(S) : Yun-Chung Na Page 1 of 1

It is certified that error appears in the above-identified patent and that said Letters Patent is hereby corrected as shown below:

In the Claims

Column 5, line 14, Claim 11: please delete "direct".

Signed and Sealed this
Twenty-seventh Day of October, 2015

Michelle K. Lee
*Director of the United States Patent and Trademark Office*